United States Patent
Liu et al.

(10) Patent No.: US 8,078,561 B2
(45) Date of Patent: Dec. 13, 2011

(54) NONLINEAR BEHAVIOR MODELS AND METHODS FOR USE THEREOF IN WIRELESS RADIO SYSTEMS

(75) Inventors: Taijun Liu, Calgary (CA); Slim Boumaiza, Waterloo (CA); Fadhel Ghannouchi, Calgary (CA)

(73) Assignee: UTI Limited Partnership, Calgary (CA)

( * ) Notice: Subject to any disclaimer, the term of this patent is extended or adjusted under 35 U.S.C. 154(b) by 1043 days.

(21) Appl. No.: 11/999,264

(22) Filed: Dec. 3, 2007

(65) Prior Publication Data

US 2008/0133204 A1    Jun. 5, 2008

Related U.S. Application Data

(60) Provisional application No. 60/872,132, filed on Dec. 1, 2006.

(51) Int. Cl.
*G06F 17/00* (2006.01)
*G06N 5/02* (2006.01)

(52) U.S. Cl. ................................................ 706/46
(58) Field of Classification Search ................ 706/46
See application file for complete search history.

(56) References Cited

U.S. PATENT DOCUMENTS

| | | | |
|---|---|---|---|
| 6,801,086 B1 | 10/2004 | Chandrasekaran | 330/140 |
| 7,260,501 B2* | 8/2007 | Pattipatti et al. | 702/183 |
| 7,536,277 B2* | 5/2009 | Pattipatti et al. | 702/183 |
| 2003/0058959 A1 | 3/2003 | Rafie et al. | 375/296 |
| 2003/0195706 A1* | 10/2003 | Korenberg | 702/19 |
| 2005/0157814 A1 | 7/2005 | Cova et al. | 375/297 |
| 2005/0195919 A1 | 9/2005 | Cova | 375/297 |

OTHER PUBLICATIONS

Improving generalizing capability of connectionist model through emergent dynamic behavior, Wang Hong-Qi; Chen Zong-Zhi; Su Shi-Wei; Neural Networks, 1992. IJCNN., International Joint Conference on vol. 1 Digital Object Identifier: 10.1109/IJCNN.1992.287186 Publication Year: 1992 , pp. 353-358 vol. 1.*
Dynamic Item Recommendation by Topic Modeling for Social Networks, Sang Su Lee; Tagyoung Chung; McLeod, D.; Information Technology: New Generations (ITNG), 2011 Eighth International Conference on Digital Object Identifier: 10.1109/ITNG.2011.153 Publication Year: 2011 , pp. 884-889.*
Generative grammars and dynamic programming in speech recognition with learning, Vintsiuk, T.; Acoustics, Speech, and Signal Processing, IEEE International Conference on ICASSP '76. vol. 1 Digital Object Identifier: 10.1109/ICASSP.1976.1170022 Publication Year: 1976 , pp. 446-449.*
Relative coupled dynamics and control using dual number, Jianying Wang; HaiZhao Liang; Zhaowei Sun; Systems and Control in Aeronautics and Astronautics (ISSCAA), 2010 3rd International Symposium on Digital Object Identifier: 10.1109/ISSCAA.2010.5632324 Publication Year: 2010 , pp. 277-282.*
International Search Report issued in PCT/CA2007/002187 dated Mar. 19, 2008.

* cited by examiner

*Primary Examiner* — Michael B Holmes
(74) *Attorney, Agent, or Firm* — Fulbright & Jaworski L.L.P.

(57) ABSTRACT

Disclosed is a behavioral model for wide-band radio frequency transmitters. Also disclosed are various implementation of the behavioral model for purpose of baseband predistortion of dynamic nonlinear systems, such as wideband wireless transmitters and power amplifiers. In one example embodiment, a LBG behavioral model comprises two nonlinear cascading modules: a dynamic weak nonlinear (DWNL) module, which models dynamic week nonlinearities of the system, and a static strong nonlinear (SSNL) module, which models static strong nonlinearities of the system. In one example embodiment, a forward LBG model includes DWNL module followed by the SSNL module. In another example embodiment, a reverse LBG model includes SSNL module followed by DWNL module.

22 Claims, 8 Drawing Sheets

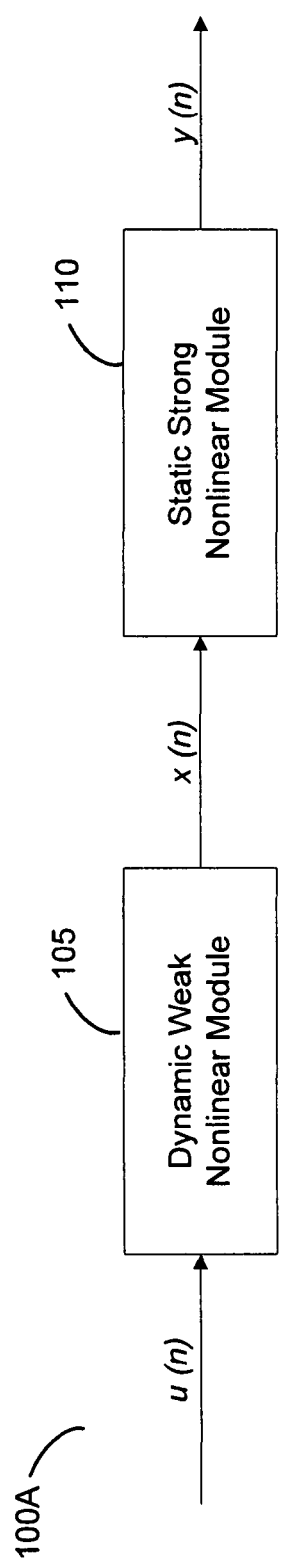
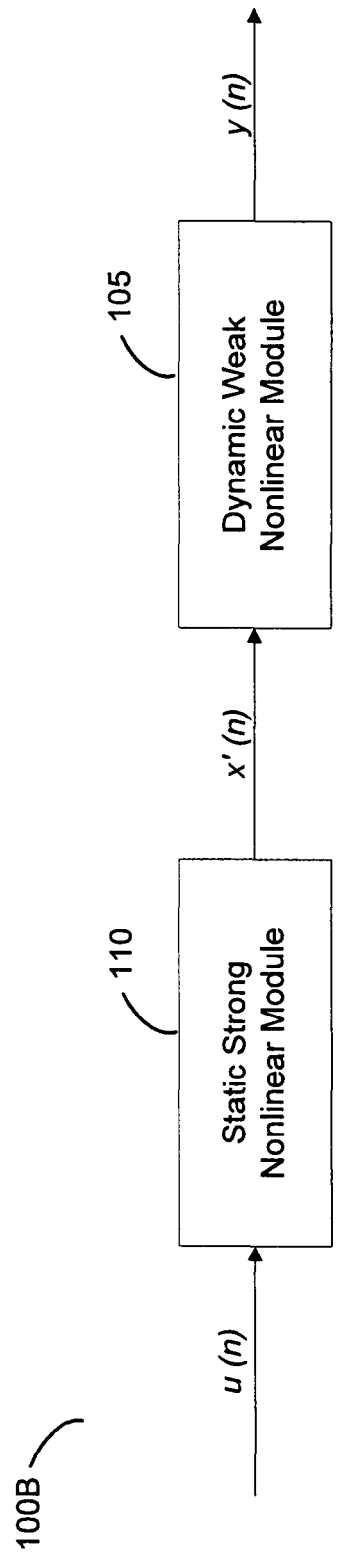

NONLINEAR BEHAVIOR MODELS AND METHODS FOR USE THEREOF IN WIRELESS RADIO SYSTEMS

CROSS-REFERENCE TO RELATED APPLICATIONS

This application claims benefit of Provisional Patent Application No. 60/872,132 filed on Dec. 1, 2006, which is incorporated by reference herein in its entirety.

TECHNOLOGY FIELD

The present disclosure relates generally to field of modeling of wireless nonlinear radio systems and more specifically to the methods for user thereof in digital baseband predistortion.

BACKGROUND

Modern wireless communication systems employ spectrally efficient, digitally modulated signals with wide bandwidths and time-varying envelopes. Such systems are very sensitive to different sources of linear and nonlinear distortions that may be exhibited by the radio frequency (RF) transmitters, especially the power amplifier (PA) stage. Hence, RF transmitters have to meet strict linearity requirements in order to avoid the signal quality deterioration and adjacent channel interference. At the same time, RF transmitters must be efficient in order to comply with low power requirements of wireless communication systems.

Amplifier nonlinearities may cause several complications in the wireless digital system and significantly complicate design of such systems. For example, they may produce a dilation/spreading of the spectrum of the input signal, which may cause adjacent channel interference. In addition to such spectral regrowth, amplifier nonlinearities may produce in-band distortions which deteriorate the integrity of the transmitted signal. The minimization of the effects of such distortion sources relies primary on accurate modeling of the RF transmitters.

There are several prior art models of dynamic nonlinear systems. However, one common problem of such models is in the identification procedure of the parameters of their different modules. Furthermore, the known models and procedures encounter high complexity and/or low accuracy. Moreover, they frequently do not account for the strong memory effects exhibited by the transmitter/PA. Thus, in most cases, they are not appropriate for implementation in broadband adaptive communications systems. Accordingly, there is a need for a new dynamic nonlinear system model that overcomes limitations of the prior art behavioral models.

OVERVIEW

Disclosed is a new behavioral model for memoryless wideband radio frequency transmitters. Also disclosed are various implementation of the behavioral model for purpose of baseband predistortion of dynamic nonlinear systems, such as wideband wireless transmitters and power amplifiers. In one example embodiment, a LBG behavioral model comprises two non-linear cascading modules: a dynamic weak nonlinear (DWNL) module, which models dynamic week nonlinearities of the system, and a static strong nonlinear (SSNL) module, which models static strong nonlinearities of the system. In one example embodiment, a forward LBG model includes a DWNL module followed by a SSNL module. In another example embodiment, a reverse LBG model includes a SSNL module followed by a DWNL module.

In one example embodiment, the SSNL module may be implemented as a AM/AM and AM/PM lookup table, which is configured to account for amplitude modulation/amplitude modulation (AM/AM) and amplitude modulation/phase modulation (AM/PM) characteristics of RF transmitters. At the same time, the DWNL module may be implemented as a plurality of nonlinear dynamic FIR-based filters which account for low- and high-order memory effects caused by dynamic properties of the transmitter in the presence of a modulated communication signal. In this manner, the disclosed LBG behavioral model accounts for nonlinearity and the memory effects that occur in broadband RF transmitters. Moreover, the dynamic behavioral model largely improves the model accuracy for wideband RF transmitters.

In one example embodiment, an augmented Wiener predistorter is disclosed which is implemented using a first-order forward LBG model. The augmented Wiener predistorter may be placed in a broadband wireless transmitter to compensate for nonlinearity and memory effects therein. The augmented Wiener predistorter includes a DWNL module followed by a SSNL module. The DWNL module may be implemented as a weak nonlinear dynamic FIR-based filter, including a linear term and a second-order term that compensate for dynamic memory effects of the wireless transmitter. The SSNL module may be implemented as AM/AM and AM/PM lookup tables, which smooth and model AM/AM and AM/PM characteristics of the wireless transmitter and power amplifiers therein.

In another example embodiment, an augmented Hammerstein predistorter is disclosed implemented using a first-order reverse LBG model. The augmented Hammerstein predistorter may be placed in a broadband wireless transmitter to compensate for nonlinearity and memory effects therein. In one example embodiment, the augmented Hammerstein predistorter may include a SSNL module followed by a DWNL module. The SSNL module may be implemented as AM/AM and AM/PM lookup tables, which smooth and model AM/AM and AM/PM characteristics of the wireless transmitter. The DWNL module may be implemented as a weak nonlinear dynamic FIR-base filter, including a linear term and a second-order term that compensate for dynamic memory effects of the wireless transmitter.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings:

FIG. 1A is a block diagram of one example embodiment of a forward LBG model;

FIG. 1B is a block diagram of one example embodiment of a reverse LBG model;

DETAILED DESCRIPTION OF EXAMPLE EMBODIMENTS

Figure 2A:
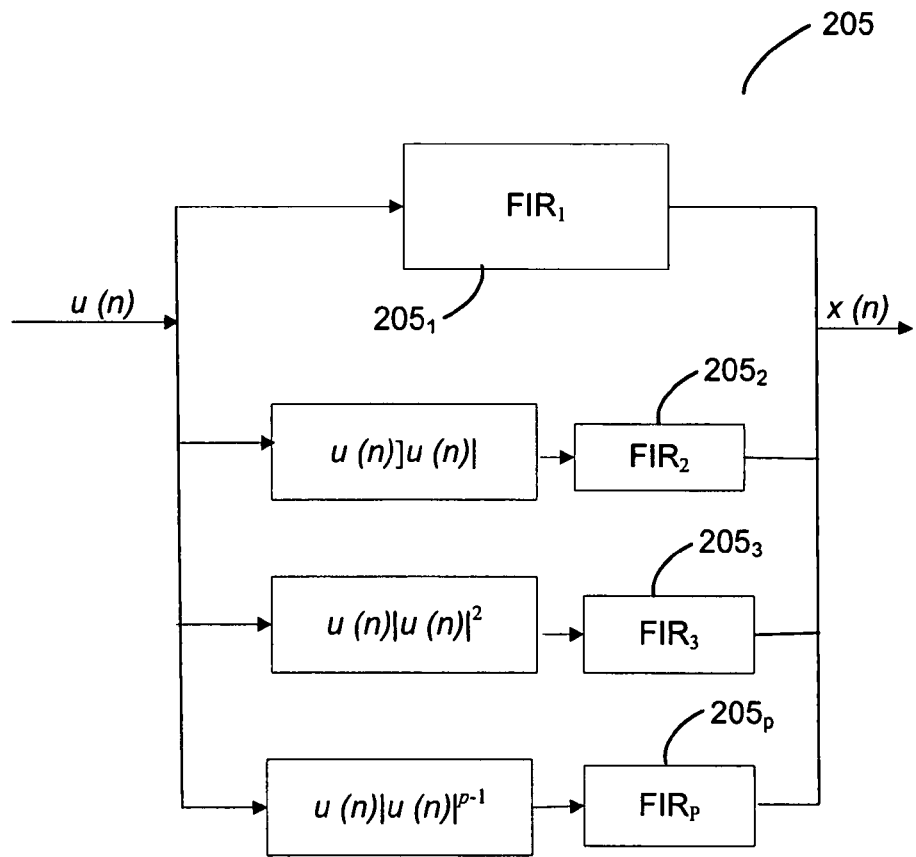
FIG. 2A is a schematic diagram of one example embodiment of the DWNL module.

Disclosed is a new behavioral model for wide-band radio frequency transmitters. Those of ordinary skill in the art will realize that the following description is illustrative only and is not intended to be in any way limiting. Various embodiments of the disclosed nonlinear system model are applicable in a variety of settings, such as baseband system modeling, baseband predistortion, RF digital predistortion and other applications. Alternative embodiments may be applied to analog as well as digital signal predistortion. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations of the nonlinear system model described herein are shown and described. It will, of course, be appreciated that in the development of any such actual implementation, numerous implementation-specific decisions must be made in order to achieve the developer's specific goals, such as compliance with application- and system-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the nonlinear system model described herein may be implemented in various types of nonlinear communication systems, such as radio frequency, optical and other types of communication systems. In addition, those of ordinary skill in the art will recognize that devices of a less general purpose nature, such as hardwired devices, field programmable gate arrays (FPGAs), application specific integrated circuits (ASICs), digital signal processors (DSP) or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device.

FIGS. 1A and 1B depict two example embodiments of a LBG model for nonlinear wireless systems. FIG. 1A depicts one example embodiment of a forward LBG model 100A, which includes a Dynamic Weak Nonlinear (DWNL) module 105 followed by a Static Strong Nonlinear (SSNL) module 110. FIG. 1B depicts one example embodiment of a reverse LBG model 100B, which includes a SSNL module 110 followed by a DWNL module 105. Those of skills in the art may recognize that either model may be used to in modeling of nonlinear wireless systems or in compensation of their impairments by using pre or post compensation. Various factors may be considered in deciding whether the forward or reverse LBG model is to be used. Such factors may include, but is not limited to, type and nature of the system being modeled, e.g., RF, optical and the like, system implementation and configuration, signal modulation technique and operating frequency of the system and other factors. In one example embodiment, the system may be modeled using both forward and reverse LBG model to determine which model more accurately characterizes communication system.

In one example embodiment, DWNL module 105 may characterize dynamic weak nonlinear distortions, which are referred to as memory effects, due to baseband frequency response, harmonic loading conditions, and trap effects that might occur in semiconductor devices of the RF transmitter, impact ionization, as well as the non-constant frequency response of the transmitter around the carrier frequency. In the context of wideband transmitters, the electrical memory effects are the dominant sources of dispersion since the thermal time constant is large compared to the inverse of the signal bandwidth.

In one example embodiment, DWNL module 105 may be implemented as a finite impulse response (FIR) filter-based multi-branch non-linear structure. FIG. 2A depicts one example embodiment of implementation of a DWNL module 105. DWNL module 200 includes a number of parallel branches in which the first branch includes a linear FIR filter $205_1$ and, in the parallel branches, the input signal u(n) is multiplied by its magnitude |u(n)|, in order to generate even-order and odd-order distortions that will be applied to FIR filters $205_2$-$205_p$. In this manner, DWNL module 200 accounts for distortions sources of the real transmitter. More specifically, DWNL module accounts for the memory effects of the transmitter. In some embodiments, a limited number of branches are enough to obtain an accurate memory effect model because only weak nonlinearities modeled. The FIR filter parameters identification may be performed using the recursive least squares (RLS) algorithm, or other known techniques.

Figure 2B:
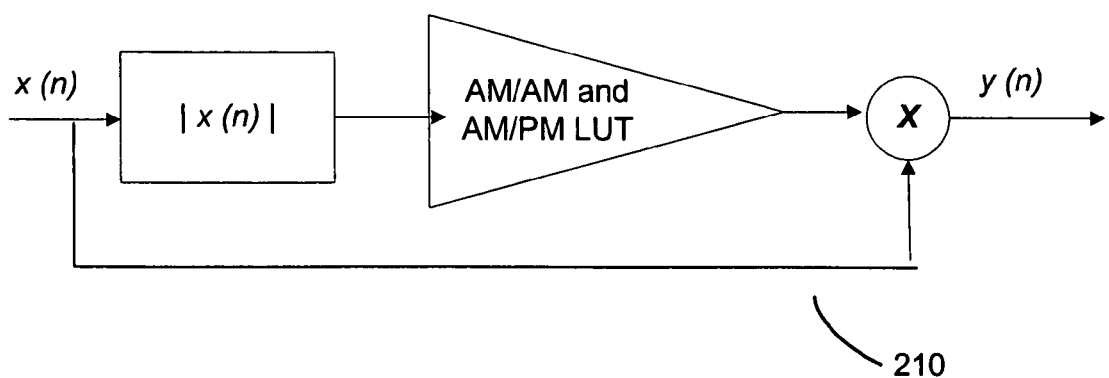
FIG. 2B is a schematic diagram of one example embodiment of the SSNL module.
Figure 5A:
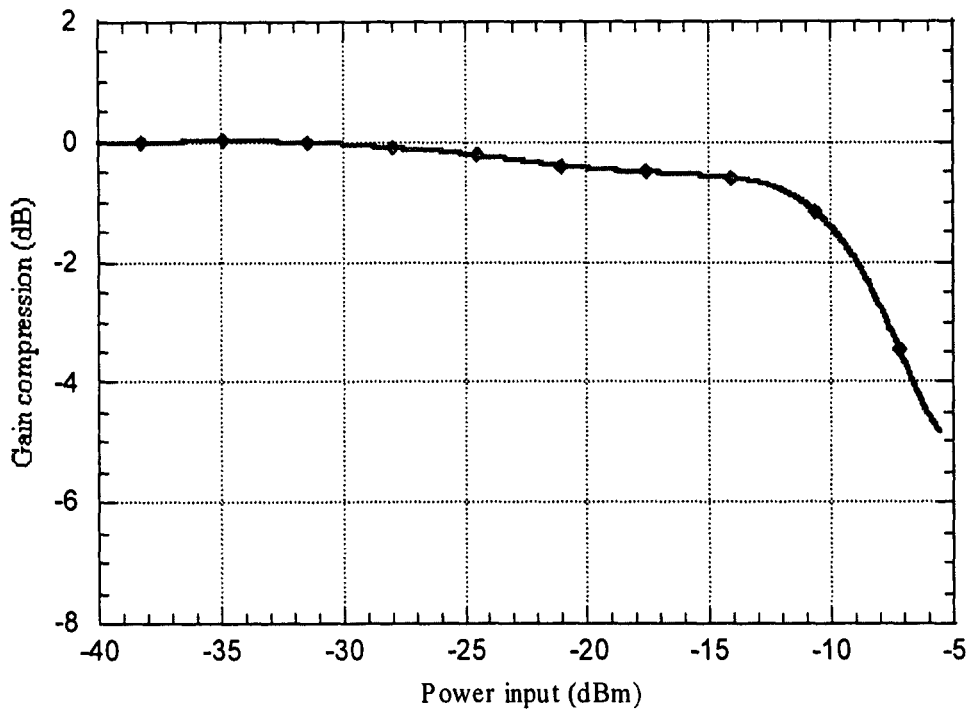
FIGS. 5A and 5B are graphs of AM/AM and AM/PM curves in accordance with one example embodiment.
Figure 5B:
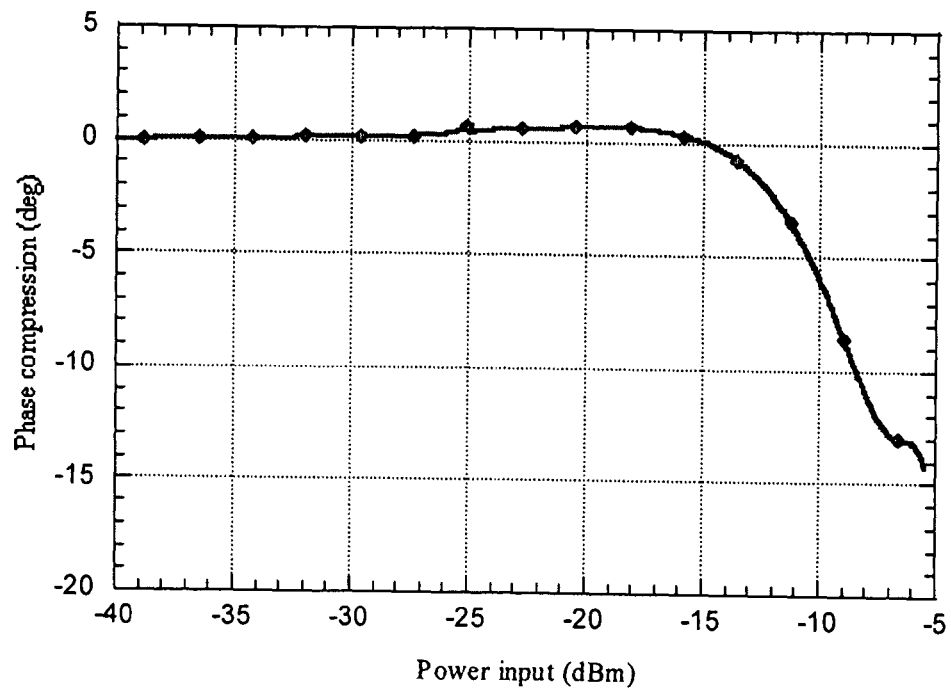

In one example embodiment, SSNL module 110 may characterize strong static nonlinearities of the wireless transmitter. FIG. 2B depicts one example embodiment of implementation of SSNL module 110. The SSNL module 110 may be implemented with two memoryless look-up tables (LUTs), which dependents on the magnitude of the input complex signal of the SSNL module in accordance with one example embodiment. The look-up tables may be derived from the amplitude modulation/amplitude modulation (AM/AM) and amplitude modulation/phase modulation (AM/PM) curves of the transmitter. These curves may be extracted directly from the baseband measurement data by means of a moving average procedure or other known techniques. FIGS. 5A and 5B show examples of the extracted AM/AM and AM/PM curves, which are based on the measurement data when the RF transmitter is driven with a three-carrier 3GPP-FDD WCDMA signal. The extracted, smoothed AM/AM and AM/PM curves are then used to construct the LUT of the SSNL module.

Figure 3A:
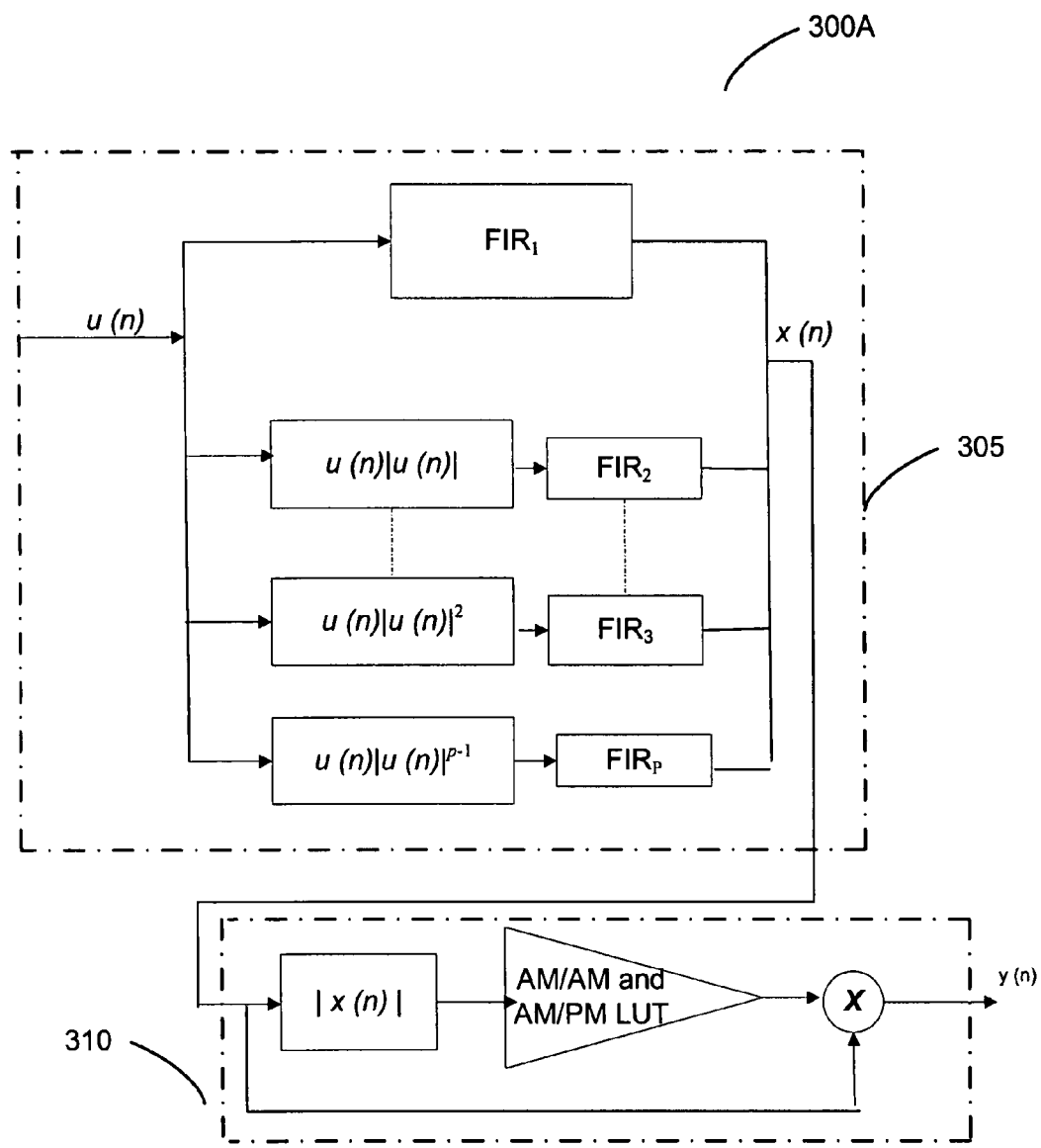
FIG. 3A is a schematic diagram of one example embodiment of a forward LBG model.

FIG. 3A depicts a schematic diagram of one implementation of a forward LBG model in accordance with one example embodiment. System 300A includes a DWNL module 305 implemented as a FIR filter based multi-branch structure cascaded with an SSNL module 310 implemented as two memoryless LUTs. The relationship between the input and output signals of the DWNL block 305 and the SSNL block 310 is described by equations 1 and 2.

$$x(n) = \sum_{i=0}^{M_1-1} a_{i,0} u(n-i) + \quad (1)$$

$$\sum_{i=0}^{M_2-1} a_{i,1}|u(n-i)|u(n-i) + + \ldots \sum_{i=0}^{M_p-1} a_{i,p-1}|u(n-i)|^{p-1} u(n-i)$$

$$y(n) = [G_{lut,i}(|x(n)|) + jG_{lut,q}(|x(n)|)]x(n) = G_{lut}(|x(n)|)x(n) \quad (2)$$

where $G_{lut}(|x(n)|) = G_{lut,i}(|x(n)|) + jG_{lut,q}(|x(n)|)$ denotes the memoryless complex gain of the transmitter that depends only on the instantaneous magnitude of x(n). x(n) is the output signal of the weak dynamic nonlinear filter. $M_k$ stands for the number of taps in the $k^{th}$ FIR filter $FIR_j$, k=1, 2, ..., p; p represents the number of the branches of the memory model, and $a_i$ is the coefficients of the FIR filters.

Figure 3B:
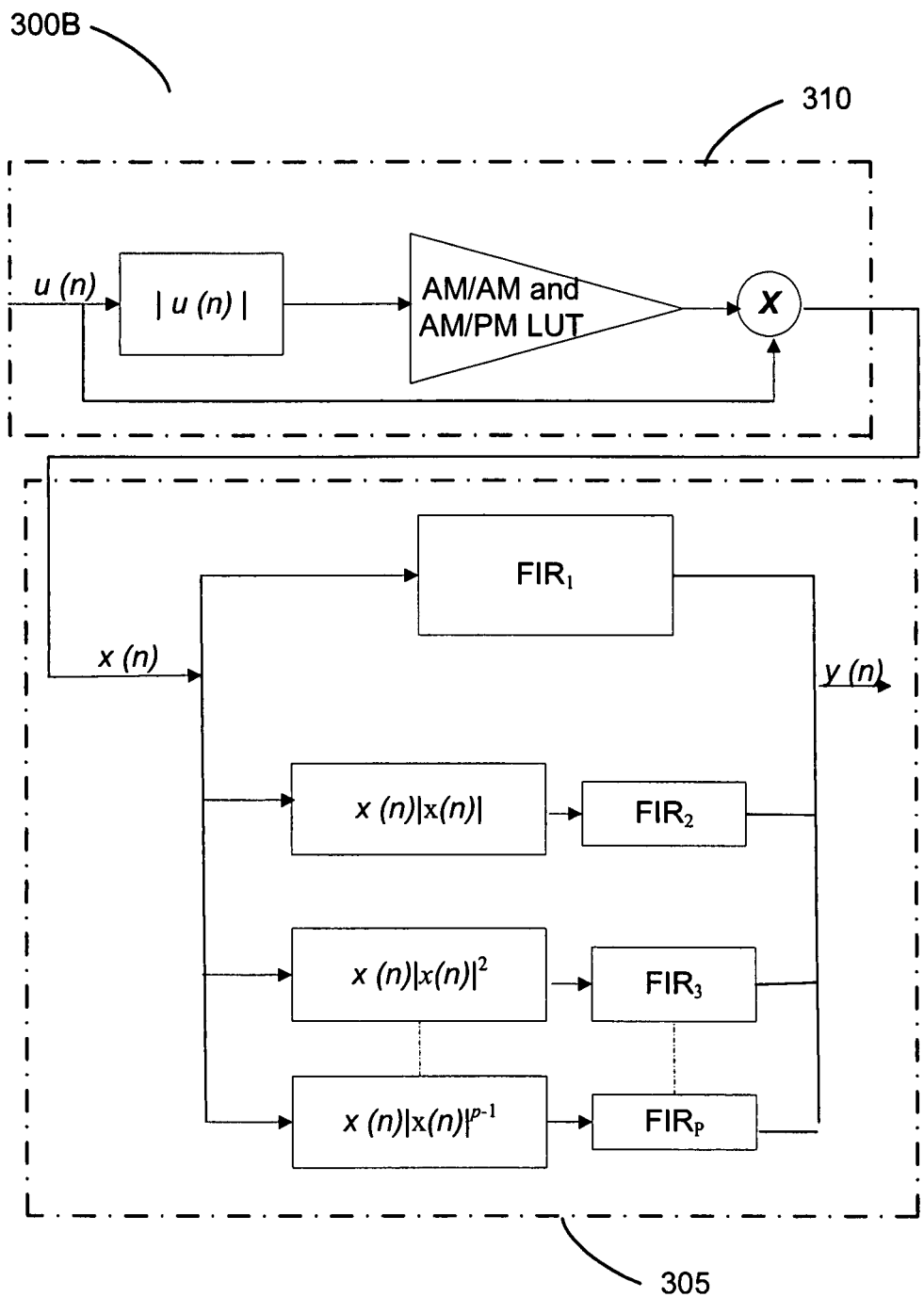
FIG. 3B is a schematic diagram of one example embodiment of a reverse LBG model.

FIG. 3B depicts a schematic diagram of one implementation of a reverse LBG model in accordance with one example embodiment. System 300B includes an SSNL block 310 implemented as two memoryless LUTs cascaded with a DWNL block 305 implemented as a FIR filter based multibranch structure. The relationship between the input and output signals of the SSNL block 310 and the DWNL block 305 is described by equations 3 and 4.

$$x(n) = [G_{lut,i}(|u(n)|) + jG_{lut,q}(|u(n)|)]u(n) = G_{lut}(|u(n)|)u(n) \quad (3)$$

$$y(n) = \sum_{i=0}^{M_1-1} a_{i,0} x(n-i) + \quad (4)$$

$$\sum_{i=0}^{M_2-1} a_{i,1}|x(n-i)|x(n-i) + + \ldots \sum_{i=0}^{M_p-1} a_{i,p-1}|x(n-i)|^{p-1} x(n-i)$$

where $G_{lut}(|u(n)|) = G_{lut,i}(|u(n)|) + jG_{lut,q}(|u(n)|)$ denotes the memoryless complex gain of the transmitter that depends only on the instantaneous magnitude of u(n). $M_k$, p and $a_i$ have the same meaning as in (1) and (2).

As indicated by equation 1-4, knowledge of the static strong nonlinear part of the nonlinear model can substantially reduce the required number of branches of the DWNL module required for accurately modeling the dynamic nonlinearity of the nonlinear system.

In one example embodiment, the forward LBG model and the reverse LBG model may be used to provide pre-compensation for the transmitter output spectrum regrowth caused by the dynamic nonlinearity of the transmitter. In accordance with various embodiments, the forward LBG model and the reverse LBG model can be used to effect a predistortion scheme in which different types of power amplifiers (PAs) are implemented. Such PAs may include for example, a push-pull FET PA, an LDMOS class AB PA, and a Doherty PA. The effectiveness of the forward and reverse LBG models in accordance with various embodiments has been experimentally validated for a push-pull FET PA, an LDMOS class AB PA, and two Doherty PAs, having 1-4 carrier WCDMA test signals, respectively.

In one example embodiment, a wireless communication system in which a predistorter in accordance with various embodiments may be used may include a wideband RF transmitter having two digital-to-analog converters (DAC), an RF vector modulator and a power amplifier. The last amplification stage of the power amplifier built for this work, in the band of 1930-1990 MHz, is based on a 60-watt PEP push-pull FET transistor (FLL600IQ-2) from Eudyna Devices USA. A driver amplifier, based on an MRF19045 LDMOS transistor and an MHL19936 gain block both from Freescale Semiconductor, is used as the driver stage. The whole line-up has 53 dB gain and 45 dBm saturated power. Furthermore, an electronic signal generator (ESG: Agilent E4438C) is utilized in this work to emulate the rest of the transmitter.

Figure 4A:
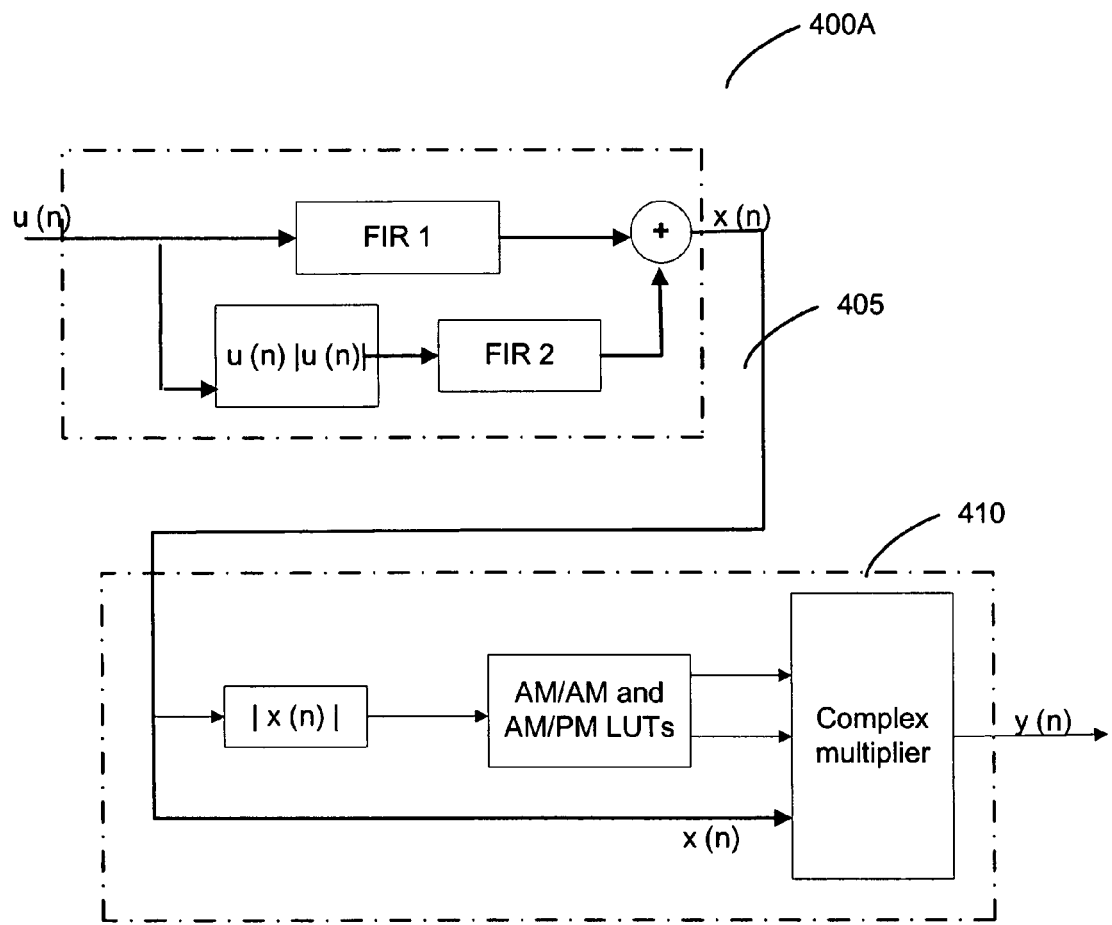
FIG. 4A is a schematic diagram of one example embodiment of an augmented Wiener predistorter implemented using first-order forward LBG model.

In one example embodiment, a first-order forward LBG model may be used to implement an augmented Wiener predistorter. Various embodiments of the invention may be of higher order. The augmented Wiener predistorter may be used in a broadband wireless transmitter to compensate for nonlinearity and memory effects thereof. FIG. 4A illustrates an example embodiment of the augmented Wiener predistorter. The predistorter 400A includes a DWNL module 405 followed by a SSNL module 410. The DWNL module 405 may be implemented as a weak dynamic nonlinear FIR-based filter, including a linear term and a second-order term that compensate for dynamic memory effects of the wireless transmitter. The nonlinear FIR-based filter acts as a nonlinear equalizer. The SSNL module 410 may be implemented as AM/AM and AM/PM lookup tables, which smooth AM/AM and AM/PM characteristics of the wireless transmitter and power amplifiers therein.

Figure 6A:
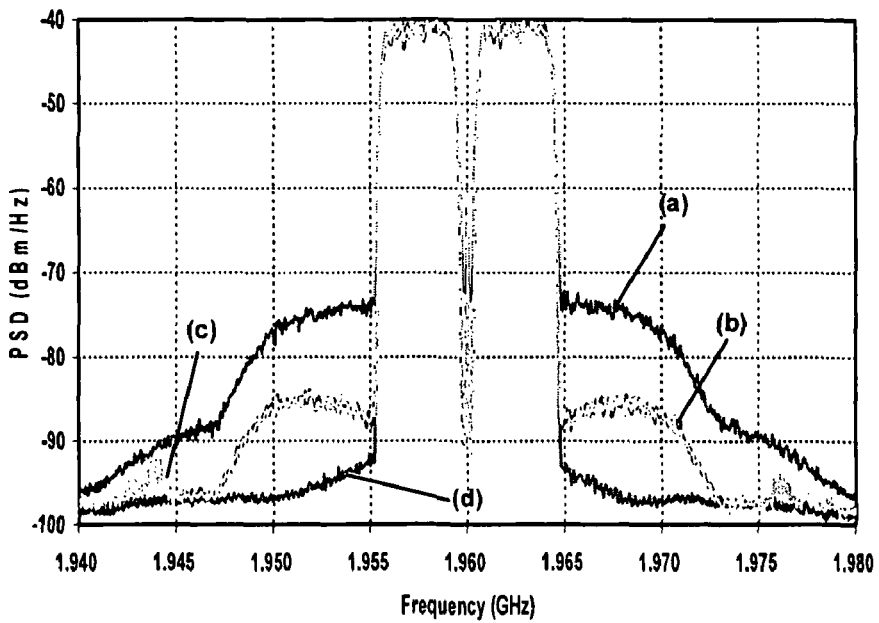
FIGS. 6A and 6B are graphs of spectrum comparison of the different LBG-model-based predistorters.

The relationship between the input and output signals of the DWNL module 405 and the SSNL module 410 in FIG. 4A may be described with equations 5 and 6.

$$x(n) = \sum_{i=0}^{M_1-1} a_{i,0} u(n-i) + \sum_{i=0}^{M_2-1} a_{i,1}|u(n-i)|u(n-i) \quad (5)$$

$$y(n) = [G_{lut,i}(|x(n)|) + jG_{lut,q}(|x(n)|)]x(n) = G_{lut}(|x(n)|)x(n) \quad (6)$$

where $G_{lut}(|u(n)|) = G_{lut,i}(|u(n)|) + jG_{lut,q}(|u(n)|)$ denotes the memoryless complex gain of the transmitter that depends only on the instantaneous magnitude of u(n). $M_j$, p and $a_i$ have the same meaning as in (1) and (2). FIG. 6A illustrates spectrum comparison of the forward LBG-model-based predistorter and the transmitter: (a) measured spectrum of the transmitter (without predistorter); (b) memoryless predistorter; (c) Wiener predistorter with a 64-tap FIR filter; (d) first order forward LBG-model-based predistorter (augmented Wiener predistorter) with two 3-tap FIR filters.

Figure 4B:
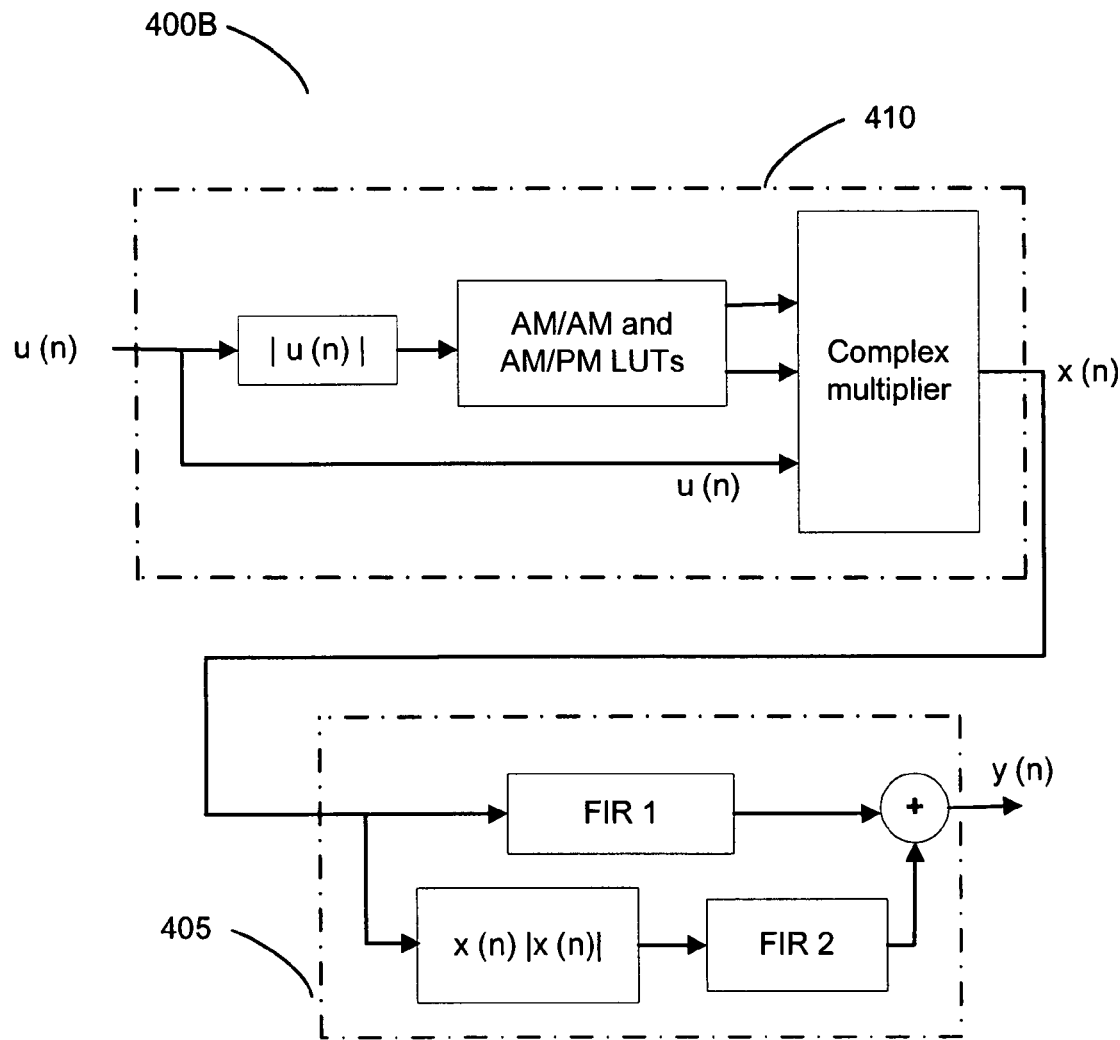
FIG. 4B is a schematic diagram of one example embodiment of an augmented Hammerstein predistorter implemented using first-order reverse LBG model.

In another example embodiment, a first-order reverse LBG model may be used to implement an augmented Hammerstein predistorter. The augmented Hammerstein predistorter may be placed in a broadband wireless transmitter to compensate for nonlinearity and memory effects thereof. FIG. 4B illustrates one example embodiment of the augmented Hammerstein predistorter. Predistorter 400B includes a SSNL module 410 followed by a DWNL module 405. The SSNL module 410 may be implemented as AM/AM and AM/PM lookup tables, which smooth AM/AM and AM/PM characteristics of the wireless transmitter. The DWNL module 405 may be implemented as a weak nonlinear dynamic FIR-based filter, including a linear term and a second-order term that compensate for memory effects of the wireless transmitter. The nonlinear FIR-based filter acts as a nonlinear equalizer.

Figure 6B:
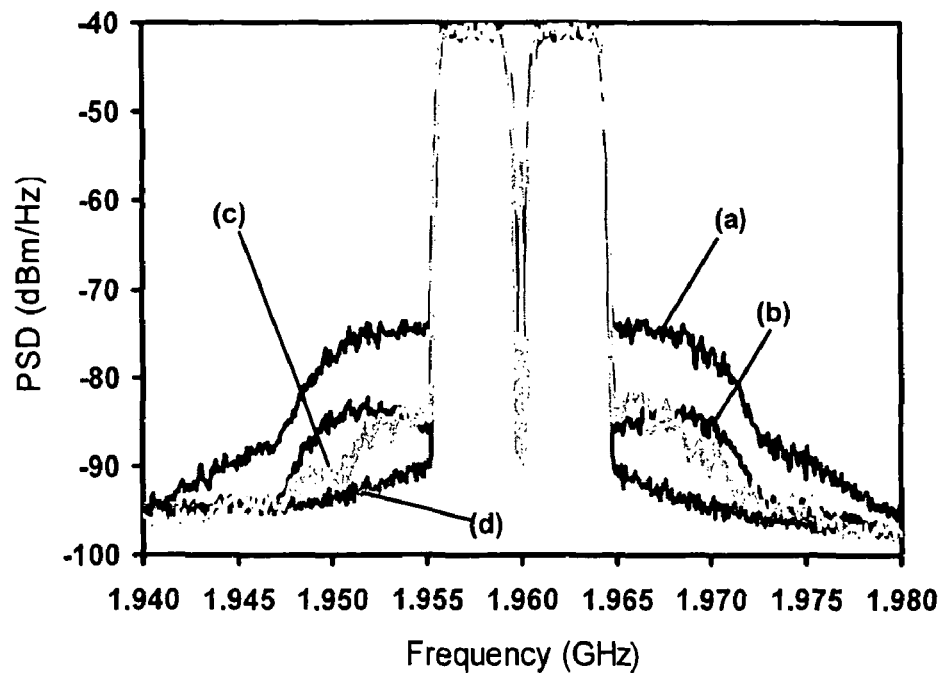

The relationship between the input and output signals of the SSNL module 410 and the DWNL module 405 in FIG. 4B may be described with equations 7 and 8.

$$x(n) = [G_{lut,i}(|u(n)|) + jG_{lut,q}(|u(n)|)]u(n) = G_{lut}(|u(n)|)u(n) \quad (7)$$

$$y(n) = \sum_{i=0}^{M_1-1} a_{i,0} x(n-i) + \sum_{i=0}^{M_2-1} a_{i,1} |x(n-i)| x(n-i) + \quad (8)$$

where $G_{lut}(|u(n)|)=G_{lut,i}(|u(n)|)+jG_{lut,q}(|u(n)|)$ denotes the memoryless complex gain of the transmitter that depends only on the instantaneous magnitude of u(n). $M_k$, p and $a_i$ have the same meaning as in (1) and (2). FIG. 6B illustrates spectrum comparison of the reverse LBG-model-based predistorter and the transmitter: (a) measured spectrum of the transmitter (without predistorter); (b) memoryless predistorter; (c) Hammerstein predistorter with a 64-tap FIR filter; (d) first order reverse LBG-model-based predistorter (augmented Hammerstein predistorter) with two 3-tap FIR filter.

Although various embodiments are described as implementing a-finite impulse response (FIR) linear filter, alternative embodiments may implement other types of linear filters (e.g., an infinite impulse response (IIR) filter or an autoregressive moving average (ARMA) filter). Moreover, although described in the context of digital predistortion, the predistortion techniques described are equally applicable to analog predistortion. In various embodiments, the disclosed forward and reversed LBG-model-based predistorters may be used for modeling of wireless wide-band RF transmitters in a 3G systems.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A behavioral model of a nonlinear dynamic system, the model comprising:
a first module characterizing dynamic nonlinear characteristics of the system, wherein the first module includes an input and an output; and
a second module characterizing static nonlinear characteristics of the nonlinear system, wherein the second module includes an input and an output;
wherein the first module is coupled to the second module.

2. The model of claim 1, wherein the first module is coupled to the second module such that an output of the first module is input to the second module.

3. The method of claim 1, wherein the second module is coupled to the first module such that an output of the second module is input to the first module.

4. The model of claim 1 wherein the first module comprises a nonlinear finite impulse response-based memory effect system and the second module comprises a look-up table-based nonlinear memoryless system.

5. The model of claim 1 wherein the first module is a dynamic weak nonlinear model and the second module is a static strong nonlinear model.

6. The model of claim 1 wherein the first module comprises a finite impulse response filter-based multi-branch nonlinear system and the second module comprises two look-up tables, each look-up table dependent on the magnitude of the input signal.

7. A predistorter for nonlinear wireless system, the predistorter comprising:
a dynamic nonlinear predistorter module; and
a static nonlinear predistorter module coupled to the dynamic nonlinear predistorter module such that an output of the dynamic nonlinear predistorter module is input to the static nonlinear predistorter module.

8. The predistorter of claim 7 wherein the dynamic nonlinear predistorter is a finite impulse response-based memory effect predistorter and the static nonlinear predistorter is a look-up table-based memoryless predistorter.

9. The predistorter of claim 7 wherein the dynamic nonlinear predistorter is a dynamic weak nonlinear predistorter and the static nonlinear predistorter is a static strong nonlinear predistorter.

10. The predistorter of claim 9 wherein the dynamic weak nonlinear predistorter is implemented as a finite impulse response filter-based multi-branch nonlinear structure embedded within a polynomial like series and the static strong nonlinear predistorter includes two look-up tables, each look-up table depends on the magnitude of a current input signal.

11. A predistorter for nonlinear wireless system, the predistorter comprising:
a static nonlinear predistorter module; and
dynamic nonlinear predistorter module coupled to the static nonlinear predistorter module such that an output of the static nonlinear predistorter module is input to the dynamic nonlinear predistorter module.

12. The predistorter of claim 11 wherein the dynamic nonlinear predistorter module is a finite impulse response-based memory effect predistorter module and the static nonlinear predistorter is a look-up table-based memoryless predistorter module.

13. The predistorter of claim 11 wherein the dynamic nonlinear predistorter module is a dynamic weak nonlinear predistorter module and the static nonlinear predistorter is a static strong nonlinear predistorter module.

14. The predistorter of claim 12 wherein the dynamic weak nonlinear predistorter is implemented as a finite impulse response filter-based multi-branch nonlinear structure and the static strong nonlinear predistorter includes two look-up tables, each look-up table depends on the magnitude of a current input signal.

15. An augmented Wiener predistorter, the predistorter comprising:
a dynamic nonlinear first order predistorter module; and
a static nonlinear predistorter module coupled to the dynamic nonlinear predistorter module such that an output of the dynamic nonlinear predistorter module is input to the static nonlinear predistorter module.

16. The predistorter of claim 15 wherein the dynamic nonlinear predistorter is a finite impulse response-based memory effect predistorter and the static nonlinear predistorter is a look-up table-based memoryless predistorter.

17. The predistorter of claim 15 wherein the dynamic nonlinear predistorter is a dynamic weak nonlinear predistorter and the static nonlinear predistorter is a static strong nonlinear predistorter.

18. The predistorter of claim 17 wherein the dynamic weak nonlinear predistorter is implemented as a finite impulse response filter-based multi-branch nonlinear structure and the static strong nonlinear predistorter includes two look-up tables, each look-up table depends on the magnitude of a current input signal.

19. An augmented Hammerstein predistorter, the predistorter comprising:
a static nonlinear predistorter module; and
a dynamic nonlinear first order predistorter module coupled to the static nonlinear predistorter module such that an output of the static nonlinear predistorter module is input to the dynamic nonlinear predistorter module.

20. The predistorter of claim 19 wherein the dynamic nonlinear predistorter module is a finite impulse response-based memory effect predistorter module and the static nonlinear predistorter is a look-up table-based memoryless predistorter module.

21. The predistorter of claim 19 wherein the dynamic nonlinear predistorter module is a dynamic weak nonlinear predistorter module and the static nonlinear predistorter is a static strong nonlinear predistorter module.

22. The predistorter of claim 21 wherein the dynamic weak nonlinear predistorter is implemented as a finite impulse response filter-based multi-branch nonlinear structure and the static strong nonlinear predistorter includes two look-up tables, each look-up table depends on the magnitude of a current input signal.

* * * * *